United States Patent [19]

Feigt et al.

[11] Patent Number: 4,604,634

[45] Date of Patent: Aug. 5, 1986

[54] APPARATUS FOR RECORDING AND REPRODUCING AN ELECTROGRAPHIC IMAGE

[75] Inventors: Ingmar Feigt, Langensendelbach; Ernst Feldtkeller, Munich; Gottfried Lange, Erlangen, all of Fed. Rep. of Germany

[73] Assignee: Siemens Aktiengesellschaft, Berlin and Munich, Fed. Rep. of Germany

[21] Appl. No.: 833,671

[22] Filed: Feb. 26, 1986

Related U.S. Application Data

[63] Continuation of Ser. No. 592,313, Mar. 22, 1984, abandoned.

[30] Foreign Application Priority Data

Apr. 15, 1983 [DE] Fed. Rep. of Germany ....... 3313764

[51] Int. Cl.$^4$ .............................................. G01D 15/14
[52] U.S. Cl. .................................... 346/160; 346/108; 250/213 VT; 250/370
[58] Field of Search ............................... 346/108, 160; 250/213 R, 213 A, 213 VT, 315.3, 370; 358/111; 378/32, 29

[56] References Cited

U.S. PATENT DOCUMENTS 4,201,994 5/1980 Hoshito et al. .
4,341,954 7/1982 Mizushima et al. .

FOREIGN PATENT DOCUMENTS 0075858 4/1982 Fed. Rep. of Germany .

OTHER PUBLICATIONS

Journal of Applied Photographic Eng., A Method of Electronic Readout of Electrophotographic and Electroradiographic Images, Korn, et al., Fall 78, pp. 178-182.

*Primary Examiner*—A. Evans
*Attorney, Agent, or Firm*—John Francis Moran

[57] ABSTRACT

The invention concerns electroradiographic image recording and reproducing apparatus in which a radiation image is stored as an electrical charge pattern in a photoconductive layer (6). This image is then converted, by scanning with a beam of light (22), into a sequence of electrical signals which are picked up by strip electrodes (7) arranged on the photoconductive layer surface. The signal-noise ratio may be improved and a large number of amplifiers may be eliminated, according to the invention, by providing a discharge electrode (8) on the photoconductive layer (6) at a distance from the ends of strip electrodes (7). During read-out, the respective strip electrode (7) along which the scanning takes place is electrically connected with the discharge electrode (8) by illuminating (23) the intermediate space (25) between the latter and the strip electrode (7). Such an apparatus is useful, in particular, for the visual reproduction of X-ray images in medical X-ray diagnostics.

1 Claim, 2 Drawing Figures

APPARATUS FOR RECORDING AND REPRODUCING AN ELECTROGRAPHIC IMAGE

CROSS-REFERENCE TO RELATED APPLICATION

This is a continuation of Ser. No. 592,313 filed Mar. 22, 1984 abandoned.

BACKGROUND OF THE INVENTION

The invention relates to apparatus for recording an reproducing electroradiographic images. Apparatus of this general type is known, for example, from the article "A Method of Electronic Read-Out of Electrophotographic and Electroradiographic Images" by Korn et al., *Journal of Applied Photographic Engineering*, Volume 4, No. 4 (Fall 1978) pages 178–182.

The large-surface electrical recording of radiation images is usually accomplished in the following manner: First, more or less as in television recording tubes, the radiation image is projected onto a surface having electrical properties that respond to the image. Thereafter, a uniform, line-by-line scanning takes place, so that a sequence of signals is obtained which can then be processed, stored and reproduced in many ways. In one known method of image conversion a latent charge image is produced in a photoconductive layer. The charge distribution corresponding to this image is then detected as a pulse sequence as the layer is scanned line-by-line by a flying spot. In this "read-out" procedure, however, two interfering side effects occur. Unlike the situation with an electron-beam vidicon (having a surface of about 10 $cm^2$), there is a parasitic, i.e., unused, surface that is connected in parallel through a metallic contact, when the entire surface is contacted, due to the very large surfaces (about 1200 $cm^2$), required in this type of system. As a result, there is not only an increase in the stray capacitance parallel to the point that is to be read out and a consequent reduction in the signal voltage, but, due to the dark conductivity of the photoconductor, there is also a surface area-dependent increase in the dynamic reverse current background. An improvement can be achieved in this respect by breaking up the area to be scanned through a subdivision of the contact electrode into strips. This reduces the parallel capacitance, as well as of the parasitic dark currents, which would otherwise cause an undesirable impairment of the S/N ratio. Image readout apparatus that has been improved in this manner is disclosed, for example, in the publication by Korn et al. referred to above. In the device described there, a plurality of electrically conductive strips are arranged in parallel on the surface of a photoconductive layer with each strip connected to a preamplifier and leading to a storage reading device or a reproduction system. Such an arrangement is costly, however, because a separate amplifier must be provided for each strip. Arrangements of this kind are not well suited to produce the resolutions required for the reproduction of diagnostic X-ray images, for example, because the expense of providing multiple amplifiers is too great with the large number of strips that are necessary for avoidance of artefacts.

SUMMARY OF THE INVENTION

An object of the present invention is to provide photoelectric image read-out apparatus for an electroradiographic imaging system in which the read-out electrode is divided into narrow strips.

A further object of the present invention is to provide photoelectric read-out apparatus having an improved signal-to-noise ratio over similar apparatus of the prior art.

A further object of the present invention is to provide photoelectric read-out apparatus of the above noted type which does not require the use of a large number of amplifiers.

These objects, as well as other objects which will become apparent from the discussion that follows, are achieved, according to the present invention, by providing apparatus of the following construction:

A plurality of strip electrodes are arranged on the surface of the photoconductive layer and at least one discharge electrode is arranged on this surface and spaced apart from the strip electrodes by a small gap. This gap is thus bridged by the photoconductive material of the photoconductive layer.

A device is provided to scan the surface of the strip electrodes with a first radiation beam to thereby convert the electrostatic image stored in the photoconductive layer into electrical signals. Another device is provided for radiating the photoconductive material in the gap between the discharge electrode and successive ones of the strip electrodes to thereby electrically connect the discharge electrode to respective ones of the strip electrodes.

In the image-recording and reproducing apparatus according to the invention, use is made, on the one hand, of the breaking up of the storage surface by subdivision of the read electrode into electrically conductive strips, in order to improve the signal to noise ratio. On the other hand, however, only a single amplifier is required for the transmission of the image signals, because at all times only the one specific electrically conductive strip that happens to be active during scanning is in contact with the discharge electrode. This is accomplished by having the photoelectric read-out carried out not by a one-dimensional displacement of a flying spot, as in the literature cited above, but by two-dimensional scanning of the surface to be read, as in the case of television tubes.

The (e.g.) 10 to 1000 strips of a suitable width, which are arranged in parallel and separated by gaps, for example of 10 to 100 $\mu$m, are each selectively contacted in synchronism with the surface scanning by a second scanning beam of light. This is made possible by providing, laterally to the parallel strips and at a small distance from them, another conductive strip that extends transversely to the parallel strips. To make the electrical contact in each case, the intermediate space between one parallel strip and the transverse strip is bridged by a spot of light that makes the photoconductive substrate beneath the conductive strips electrically conductive at this point. By suitable step-by-step switching (continuous or discontinuous) of the connection of the respective parallel strip with the transverse strip, it is possible to achieve a progressive action that is synchronous with the scanning. For applications on large surfaces it is desirable to extend the photoconductive layer that is to be read out to the insulated or grounded edges of the scanning surface, using suitable technological procedures such as vapor deposition, because the film-formation and the external contacting can then be done in a single manufacturing step.

The forgoing as well as other objects, features and advantages of the invention will become apparent from the following, more particular description of the preferred embodiments of the invention, as illustrated in the accompanying drawings.

DESCRIPTION OF THE PREFERRED EMBODIMENTS

Figure 1:
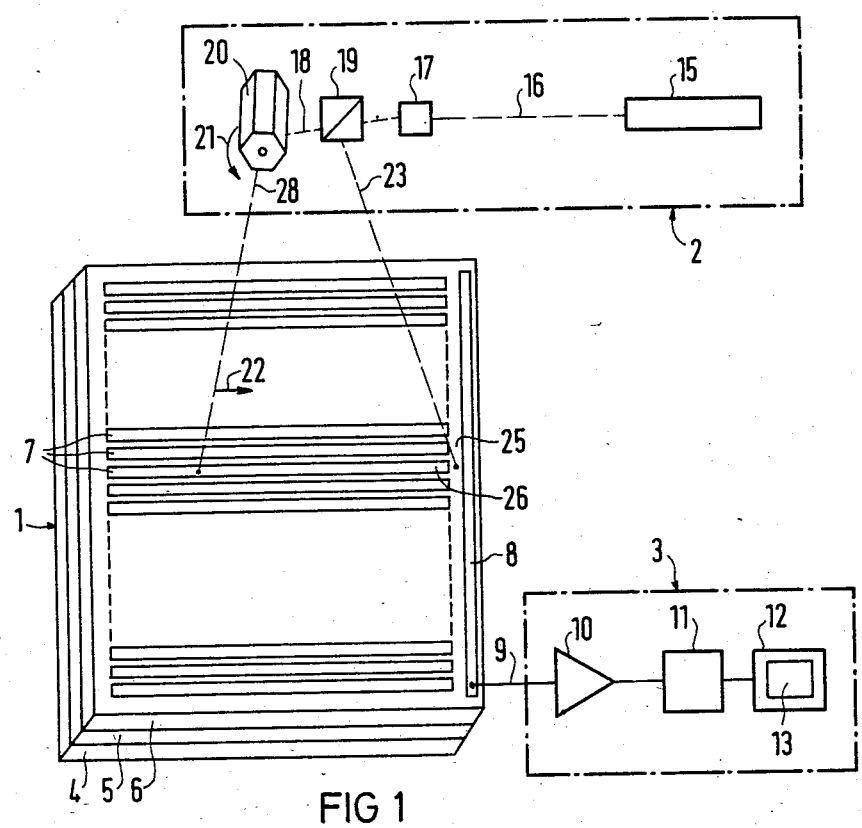
FIG. 1 is a block and representational diagram of the recording and reproducing apparatus according to a first preferred embodiment of the present invention.

FIG. 1 illustrates one preferred embodiment of the image-recording and reproducing apparatus according to the present invention. This apparatus comprises a recording plate 1, a scanning device 2, as well as a signal processing system 3. The plate 1 consists of a film which is formed on an electrically non-conducting substrate 4. The substrate 4 might be 0.1 mm thick, for example, and be made of glass or plastic. Instead of the substrate 4 it is also possible to use a luminescent X-ray intensifying screen in order to strengthen the effect of the image-forming radiation. The substrate 4 is covered with a conductive layer 5, which might consist of indium tin oxide, for example. This conductive layer 5 is covered, in turn, with a photoconductive layer 6 about 10 $\mu$m thick, which might be made of selenium. In place of the selenium layer 6 it is also possible to use the above-mentioned multiple layer structure (the selenium layer 6 with an intensifying screen).

On the surface of the layer 6 are arranged a plurality of parallel strip-shaped electrodes 7. It is preferable for the strip electrodes 7 to be made of gold (Au) and to have, in each case, a width of 0.1 to 1 mm, for example, with spaces between them of 50 $\mu$m, for example. At one end of the electrodes 7, at a distance of 0.1 to 1 mm, for example, there is located an additional, transverse, electrically conducting surface 8 that serves as a discharge electrode. This electrode 8 is connected by an external wire 9 to an amplifier 10 which, in turn, is connected to a computer 11 having a memory. Connected to the computer is a monitor 12 with a screen 13 for reproducing the recorded image.

The device 2 for scanning the image surface, or more particularly the strip electrodes 7, on the photoconductive layer 6 includes a laser beam generator 15. This generator 15 emits a beam 16 which passes through a light deflector 17 to a beam splitter 19. From the beam splitter 19 there emerges a first beam 18 which is directed to a deflecting prism 20. The prism is rotated in the direction of the arrow 21 so as to scan the deflected beam 28 along the strip electrodes 7 as indicated by an arrow 22. The second beam 23 emerging from the splitter 19 is directed to the space 25 between the end 26 of the scanned electrode 7 and the discharge electrode 8, making the photoconductive layer 6 electrically conductive at that point. Consequently, with the embodiment shown in FIG. 1, the electrode 7 that is struck by the beam 28 is electrically connected to the discharge electrode 8.

In order to record a charge pattern or latent electrostatic image on the surface of the photoconductive layer 6 that is equipped with the electrodes 7, the layer is first uniformly charged and then exposed to an X-ray image. This charge pattern can then be converted into a pulse sequence by scanning with the beam 28. This beam preferably consists of light having a wavelength in the range of 300 to 700 mm and a power output between 1 $\mu$W to 10 mW. As mentioned previously, the beam 28 is set into scanning motion in the direction indicated by the arrow 22. After sweeping over one scanning line, the beam 28 is guided to the next line by the beam deflector 17. The number of scanning lines need not correspond to the number of strip electrodes. Since the beam deflector 17 also controls the direction of the beam 23, this beam 23 always strikes the layer 6 at the end of the scanning line on which the beam 28 is located. In this way, the strip electrode 7 that is connected to the discharge electrode 8 through the gap 25 is always the one located on the line that is just being scanned.

Figure 2:
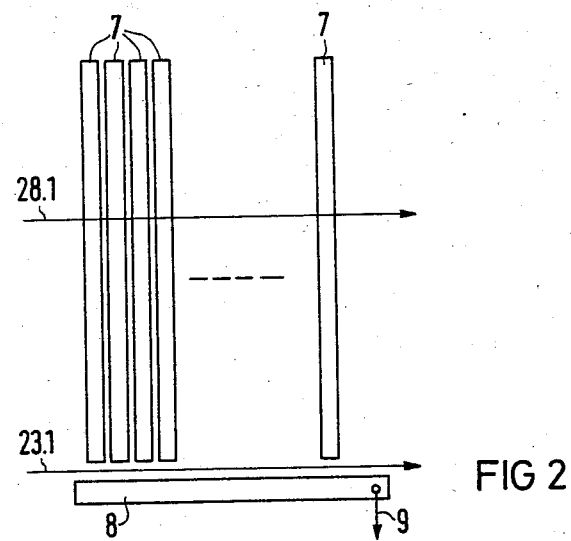
FIG. 2 is a representational diagram showing strip electrodes arranged on the surface of a photoconductive layer according to a second preferred embodiment of the present invention.

FIG. 2 shows a top view of the recording plate 1. In this case both the construction of the film with regard to the support element 4, the base electrode 5, the photoconductive layer 6, and the arrangement of the strip electrodes 7, as well as the discharge electrode 8 and the external wire 9 are all identical to that employed in the embodiment of FIG. 1. The only difference is the direction 28.1 of the scanning beam 28, since in this case this direction is at an angle to the longitudinal axis of the strips 7. The beam 23 follows the path 23.1 parallel to the path 28.1 and, at the point of impact with the photoconductor effects the respective connection between the discharge electrode 8 and the strip electrode 7 that is then being scanned by the beam 28. The electrode 8 is then connected, by means of the discharge wire 9, with the signal processing system 3 in the manner shown in FIG. 1. The sole difference in the reconstruction of the image consists in the fact that the scanning lines 28.1, unlike those shown in FIG. 1, run perpendicular to the strip electrodes 7.

In the arrangement used in FIG. 1, the electrode strips 7 are parallel to the scanning direction of the laser beam 28, indicated by the arrow 22. In this case the read-out amplifier 10 is connected to the next subsequent electrode strip 7 only after one or more lines have been scanned by the beam 28. It is necessary for the period of the electrode strips (i.e., the number of strips per centimeter) to be very close to an integral multiple of the scanning line period (number of scan lines per centimeter), so that there are no undesirable "Moiré effects" in the image.

In FIG. 2, the electrode strips 7 are arranged at an angle that differs significantly from zero—in this embodiment by 90° —with respect to the scanning direction 28.1 of the scanning beam 28. The amplifier 10 is successively connected, during the scanning of each successive line 28.1, to all the electrodes 7, one after the other. The means used for switching from one of the electrodes 7 to the next are the same as are shown in FIG. 1, synchronously with the beam 28. When the visual reproduction of the image takes place on the screen 13 of the monitor 12, Moiré effects are automatically avoided because, with the scan lines arranged at an angle with respect to the strip electrodes, interference phenomena between the scan lines and the strip electrodes cannot occur.

There has thus been shown and described a novel apparatus for recording and reproducing an electroradiographic image which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follows.

What is claimed is:

1. Apparatus for recording and reproducing an electroradiographic image comprising, in combination:
   (a) a photoconductive layer for storing an electrostatic radiation image;
   (b) a plurality of adjacent strip electrodes disposed substantially in parallel on the surface of said layer;
   (c) at least one discharge electrode disposed on said surface and spaced apart from said strip electrodes by a gap, said gap being bridged by photoconductive material;
   (d) first means for scanning said surface with a first radiation beam, thereby to convert an electrostatic stored image into electrical signals in said discharge electrodes, said scanning means moving said radiation beam across said surface in a linear path whose orientation is substantially transverse with respect to the longitudinal orientation of said strip electrodes; and
   (e) means for irradiating said photoconductive material in said gap between said discharge electrode and successive ones of said strip electrodes along a path substantially parallel to the orientation of the linear path, thereby to electrically connect said discharge electrode to respective ones of said strip electrodes in synchronism with the scanning of said first means.

* * * * *